United States Patent
Shiba et al.

(10) Patent No.: US 7,063,933 B2
(45) Date of Patent: Jun. 20, 2006

(54) PHOTOSENSITIVE RESIN COMPOSITION, INK-JET RECORDING HEAD USING THE COMPOSITION, AND PRODUCTION METHOD FOR THE SAME

(75) Inventors: Shoji Shiba, Kanagawa (JP); Hiroe Ishikura, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/008,221

(22) Filed: Dec. 10, 2004

(65) Prior Publication Data

US 2005/0093924 A1    May 5, 2005

Related U.S. Application Data

(63) Continuation of application No. PCT/JP04/008500, filed on Jun. 10, 2004.

(30) Foreign Application Priority Data

Jun. 16, 2003   (JP)   ............... 2003-170674

(51) Int. Cl.
G03F 7/40        (2006.01)
G03F 7/038       (2006.01)
H01L 21/311      (2006.01)
G01D 15/18       (2006.01)
B41J 2/16        (2006.01)

(52) U.S. Cl. .................. 430/270.1; 522/146; 430/320; 430/314; 430/18; 216/27; 347/56

(58) Field of Classification Search ............... None
See application file for complete search history.

(56) References Cited

U.S. PATENT DOCUMENTS

| | | | |
|---|---|---|---|
| 4,450,455 A | 5/1984 | Sugitani et al. | 346/140 R |
| 4,565,859 A | 1/1986 | Mirai et al. | 528/365 |
| 4,595,745 A * | 6/1986 | Nakano et al. | 528/125 |
| 4,657,631 A | 4/1987 | Noguchi | 156/653 |
| 4,673,773 A * | 6/1987 | Nakano et al. | 430/283.1 |
| 4,701,766 A | 10/1987 | Sugitani et al. | 346/1.1 |
| 4,775,445 A | 10/1988 | Noguchi | 156/637 |
| 4,841,017 A | 6/1989 | Murai et al. | 525/327.3 |
| 5,376,504 A * | 12/1994 | Graziano et al. | 430/270.1 |
| 5,474,876 A | 12/1995 | Haehnle et al. | 430/283 |
| 5,478,606 A | 12/1995 | Ohkuma et al. | 427/555 |
| 6,379,571 B1 | 4/2002 | Kobayashi et al. | 216/27 |
| 6,390,606 B1 | 5/2002 | Terui et al. | 347/63 |
| 6,929,891 B1 * | 8/2005 | Rushkin et al. | 430/18 |
| 2004/0094761 A1 * | 5/2004 | Sparrowe et al. | 257/40 |

FOREIGN PATENT DOCUMENTS

| | | |
|---|---|---|
| EP | 0 962320 A1 | 12/1999 |
| EP | 0 964440 A2 | 12/1999 |
| JP | 57-208255 A | 12/1982 |
| JP | 57-208256 A | 12/1982 |
| JP | 60-161973 A | 8/1985 |
| JP | 61-154947 A | 7/1986 |
| JP | 01-9216 A | 1/1989 |
| JP | 02-140219 A | 5/1990 |
| JP | 63-221121 A | 9/1998 |
| JP | 2001-10070 A | 1/2001 |

* cited by examiner

Primary Examiner—Cynthia Hamilton
(74) Attorney, Agent, or Firm—Fitzpatrick, Cella, Harper & Scinto (57) ABSTRACT

A photosensitive resin composition usable in forming an ink-jet recording head, and a production method of the head. The composition comprises a polyetheramide resin having a repeating unit represented by the following formula (1), a compound that generates an acid by light irradiation, and a crosslinking agent for the polyetheramide resin which acts under acidic conditions. The composition improves adhesion between a substrate and an ink flow path forming member which constitute the ink-jet recording head

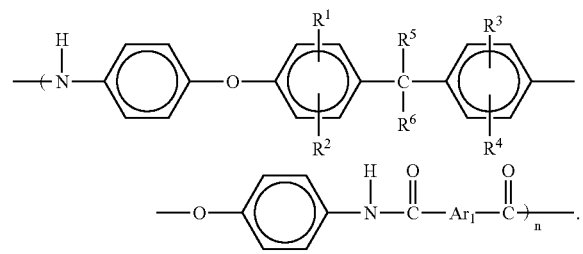

formula (1)

12 Claims, 4 Drawing Sheets

PHOTOSENSITIVE RESIN COMPOSITION, INK-JET RECORDING HEAD USING THE COMPOSITION, AND PRODUCTION METHOD FOR THE SAME

This application is a continuation of International Application No. PCT/JP2004/008500, filed Jun. 10, 2004, which claims the benefit of Japanese Patent Application No. 2003-170674 filed Jun. 16, 2003.

BACKGROUND OF THE INVENTION

1. Field of the Invention

The present invention relates to a novel photosensitive resin composition. The present invention further relates to an ink-jet recording head using the photosensitive resin composition and a production method for the same. In particular, the present invention relates to a method of improving adhesion between a substrate having a pressure generating element formed thereon for ejecting ink, and a flow path forming member for forming an ink flow path by being bound with the substrate, and a formation method for an ink supply orifice for supplying the ink to an ink flow path by passing through the substrate.

2. Related Background Art

Various proposals have conventionally been made on a production method for an ink-jet recording head, and a liquid path forming member that forms a liquid path by being bound with a substrate having an ink ejection pressure generating element formed thereon. Japanese Patent Application Laid-Open No. 57-208255 and Japanese Patent Application Laid-Open No. 57-208256 each disclose a method of forming an ink-jet recording head by forming a liquid path pattern on a substrate having an ink ejection pressure generating element formed thereon using a photosensitive resin, binding a top board made of glass or the like with the substrate, and cutting the assembly.

Hewlett-Packard Journal 36, 5 (1985) discloses a method of manufacturing an ink-jet recording head by forming a liquid path pattern on a substrate having an ink ejection pressure generating element formed thereon using a photosensitive resin, and adhering an orifice plate prepared by Ni electroforming to the substrate.

Japanese Patent Application Laid-Open No. 61-154947 discloses a method of manufacturing an ink-jet recording head by forming a liquid path pattern on an ink ejection pressure generating element on a substrate having the ink ejection pressure generating element formed thereon using a soluble resin, coating the pattern with an epoxy resin or the like, curing the resin, and eluting the soluble resin after cutting the substrate.

Japanese Patent Application Laid-Open No. 3-184868 discloses that a cationic polymerization cured product of an aromatic epoxy compound is useful for a coating resin composition most suitable for the production of the ink-jet recording head described in the above-mentioned Japanese Patent Application Laid-Open No. 61-154947.

In either of the above-described methods, the binding strength between the substrate having an ink ejection pressure generating element formed thereon and the liquid path forming member basically depends on adhesion of a resin material (photosensitive resin layer, coating resin layer) constituting a liquid path forming member.

Further, in either of the above constitutions, it is necessary to equip a head with an ink supply system for supplying ink. A structure in which a through-hole is formed on a supporting substrate to supply ink from the back of the supporting substrate is generally known in a so-called side shooter type ink-jet recording-head having a structure in which an ejection orifice of ink is arranged so as to face a pressure generating element. Known examples of a production method for such an ink-jet recording head include a method including, as described in U.S. Pat. No. 5,478,606, (1) a step of forming an ink flow path pattern on a substrate having an ink ejection pressure generating element formed thereon using a soluble resin, (2) a step of dissolving a coating resin containing a solid epoxy resin in a solvent at room temperature, and conducting solvent coating of the resultant solution on a soluble resin layer, thereby forming a coating resin layer as a liquid path forming member constituting ink flow path walls on the soluble resin layer, (3) a step of forming an ink ejection orifice on the coating layer above the ink ejection pressure generating element, and (4) a step of eluting the soluble resin layer.

In the case of a so-called bubble jet recording head in which an exothermic resistor is used as an ink ejection pressure generating element and the ink is ejected utilizing bubble formation due to film boiling of the ink, an inorganic insulating layer such as SiN or $SiO_2$ and an anti-cavitation layer such as Ta are generally provided on the exothermic resistor in order to reduce electrocorrosion by ink or damages caused by cavitation in defoaming of bubbles. However, because the Ta film has an extremely low adhesion to a resin material constituting the above-described liquid path forming member, the problem may arise in that the liquid path forming member peels off from the Ta film.

To avoid this problem, it is considered to remove the Ta film on the region on which a resin material constituting a liquid path forming member is provided, for the purpose of improving adhesion of the resin material constituting a liquid path forming member. In this case, however, the resin material constituting the liquid path forming member is laminated on the region on which an electrode connecting to an ink ejection pressure generating element comprising an electrothermal converting material on a substrate is disposed, through only the above-described inorganic insulating layer. Because an inorganic insulating layer such as SiN or $SiO_2$ generally has a porous film material, there is the possibility that ions contained in the resin permeate through the inorganic insulating layer and an electrode is corroded by the ions.

Further, an example is known, in which a substrate is subjected to silane-coupling treatment or an undercoat (adhesion improvement and passivation layer) including a polyimide (for example, PHOTONEECE, trade name, produced by Toray Industries) is used, in order to improve adhesion between the substrate having an ink ejection pressure generating element formed thereon and the liquid path forming member.

The ink-jet recording head generally has a portion that always contacts with the ink under its use environment. It must be avoided that the substrate having formed thereon an ejection pressure generating element is peeled from the liquid path forming member due to the influence of the ink. On the other hand, increasing demands for paper selectivity, water resistance of an image, and the like are made on a recent ink-jet recording system. To meet those demands, studies are being made of the possibility of shifting pH of the ink to the alkaline side. In such alkaline ink, it is sometimes difficult to maintain adhesion between a substrate having formed thereon ejection pressure generating element and a liquid path forming member over a long period of time.

In view of the above, the inventors of the present invention proposed a method of binding a substrate having an ink ejection pressure generating element formed thereon and a liquid path forming member through an adhesion layer made of a polyetheramide resin in U.S. Pat. No. 6,390,606. The inventors had found that according to this method, excellent adhesion of an alkaline ink can also be maintained over a long period of time, and further an ink-jet recording head can be provided which has high reliability that can maintain excellent adhesion over a long period of time even in the case where a metal surface such as Ta is exposed on an adhesive face.

Moreover, various methods such as cutting, sandblasting, laser beam machining, and wet etching are attempted as a method of forming through-holes constituting ink supply orifices on a substrate. However, the methods such as cutting, sandblasting, and laser beam machining involve the problems in that damages to a substrate or each constituent member are large, and in the worst case, a substrate may break during processing.

The wet etching is known as a method of forming through-holes without applying mechanical force to a substrate. The inventors of the present invention proposed a method of forming an ink supply orifice by using a silicon substrate as a substrate, using an inorganic dielectric film and a polyetheramide resin as masks, and conducting anisotropic etching to the silicon using an alkaline etchant in U.S. Pat. No. 6,379,571. According to this method, it is possible to form through-holes without applying mechanical force to a substrate.

Thus, the polyetherimide resin has excellent alkali resistance, and is therefore an excellent material as a constituent material of an ink-jet recording head which contacts with the alkaline ink and also as a mask material in conducting wet etching using an alkaline etchant. However, further improvement is demanded for the polyetheramide resin used for the above applications. Specifically, the polyetheramide resin does not have a photosensitivity by itself. Therefore, when the polyetheramide resin is subjected to patterning, it is required that a photoresist is subjected to patterning to form a mask material, and then patterning is conducted by etching. Further, it is difficult to apply wet etching to the polyetheramide resin. As a result, dry etching must be conducted, and this increases steps and requires large-scaled equipment.

SUMMARY OF THE INVENTION

The present invention has been made in view of the above-described problems, and provides an ink-jet recording head having high reliability with a simple method by providing a photosensitive resin composition suitable for use in ink jet applications.

According to one aspect of the present invention, a photosensitive resin composition includes: a polyetheramide resin having a repeating unit represented by the following formula (1); a compound that generates an acid by light irradiation, and a crosslinking agent for the polyetheramide resin which acts under acidic conditions.

Formula (1)

In further aspects of the photosensitive resin composition, the crosslinking agent for the polyetheramide resin is a condensable melamine compound or a condensable urea compound; the condensable melamine compound is a melamine compound represented by the following formula (2) and/or a condensate thereof; and the condensable melamine compound contains a monomer of hexamethoxymethyl melamine in an amount of 90% or more.

Formula (2)

According to another aspect of the present invention, an ink-jet recording head includes: an ejection orifice for ejecting ink; an ink flow path in communication with the ejection orifice; a substrate having formed thereon a pressure generating element that generates pressure for ejecting the ink from the ejection orifice; and an ink flow path forming member that forms the ink flow path by being bound with the substrate.

Wherein the ink flow path forming member is bound with the substrate through a cured product layer of the photosensitive resin composition including the polyetheramide resin having the constituent unit represented by the above formula (1), the compound that generates an acid by light irradiation, and the crosslinking agent for the polyetheramide resin which acts under acidic conditions.

In further aspects of the ink-jet recording head, the ink flow path forming member is formed of a cationic polymerization compound of an epoxy resin; the ejection orifice for ejecting the ink is provided on a side facing the pressure generating element; and the pressure generating element comprises an electrothermal converting element.

According to another aspect of the present invention, a production method for an ink-jet recording head, which includes an ejection orifice for ejecting ink, an ink flow path in communication with the ejection orifice, a substrate having formed thereon a pressure generating element that generates pressure for ejecting the ink from the ejection orifice, and an ink flow path forming member that forms the ink flow path by being bound with the substrate, includes: forming, on the substrate having formed thereon the pressure generating element, a pattern of the photosensitive resin composition including the polyetheramide resin having the constituent unit represented by the above formula (1), the compound that generates an acid by light irradiation, and the crosslinking agent for the polyetheramide resin which acts under acidic conditions; forming an ink path pattern with a soluble resin on the substrate having the pattern of the photosensitive resin composition formed thereon; forming the ink flow path forming member on the ink flow path pattern; forming the ink ejection orifice in a region of the ink path forming member which faces an arrangement position of the pressure generating element on the substrate; and forming an ink flow path by dissolving and removing the ink flow path pattern.

According to another aspect of the present invention, a production method for an ink-jet recording head, which includes an ejection orifice for ejecting ink, an ink flow path in communication with the ejection orifice, a substrate having formed thereon a pressure generating element that generates pressure for ejecting the ink from the ejection orifice, an ink flow path forming member that forms the ink flow path by being bound with the substrate, and an ink supply orifice in communication with the ink flow path by passing through the substrate, in which the ink supply orifice passing through the substrate is formed by etching using as an etching resistant mask the photosensitive resin composition including the polyetheramide resin having the constituent unit represented by the above formula (1), the compound that generates an acid by light irradiation, and the crosslinking agent for the polyetheramide resin which acts under acidic conditions.

DETAILED DESCRIPTION OF THE PREFERRED EMBODIMENTS

Embodiments of the present invention are described below in detail by referring to the accompanying drawings.

FIGS. 1 to 11 schematically show cross sections of a constitution of an ink-jet recording head according to the present invention and a production method for the same.

Figure 1:
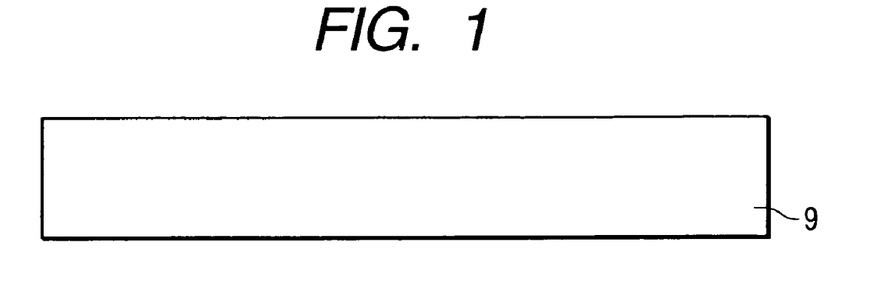
FIG. 1 is a sectional view of a silicon substrate of the present invention.

In the present invention, a silicon substrate 9 is provided as shown in, for example, FIG. 1. Such a substrate can be used without any particular limitation on its shape, material and the like, so long as it can function as a support for a liquid path forming member which forms an ink flow path and an ink ejection orifice described hereinafter. However, if an ink supply orifice passing through a substrate is formed by anisotropic etching as in this embodiment, a silicon substrate is used.

Figure 2:
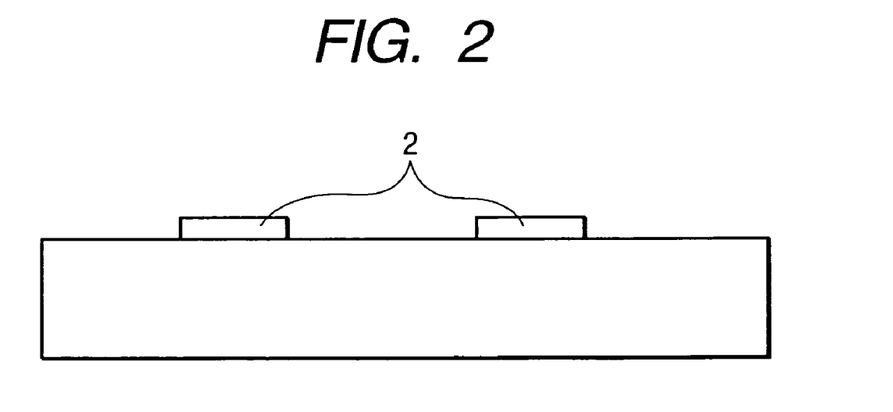
FIG. 2 is a sectional view of a silicon substrate having ink ejection pressure generating elements formed thereon of the present invention.

A desired number of ink ejection pressure generating elements 2 such as an electrothermal converting element or a piezoelectric element are arranged on the silicon substrate 9 (FIG. 2). Ejection energy for ejecting recording liquid droplets is imparted to ink by the ink ejection pressure generating element 2, and recording is performed. For example, when an electrothermal converting element is used for the ink ejection pressure generating element 2, this element heats a recording liquid in the neighborhood thereof, thereby inducing state change in the recording liquid to generate an ejection energy. Further, for example, when a piezoelectric element is used, ejection energy is generated by mechanical vibration of this element.

An electrode for control signal input (not shown) for operating the element is connected to the ejection pressure generating elements 2. In general, various functional layers such as a protective layer (not shown) are provided for the purpose of improving durability of the ejection pressure generating elements 2. There is as a matter of course no problem on provision of such functional layers in the present invention.

An electrothermal converting element generally used as the ejection pressure generating element has a structure in which an exposed portion (electrothermal converting element) of an exothermic resistance layer connected to a pair of electrodes is arranged between those electrodes by patterning a laminated structure having an electrode layer laminated on the exothermic resistance layer into a desired wiring pattern and removing a predetermined portion of the electrode layer to expose the exothermic resistance layer present under the portion.

Figure 3:
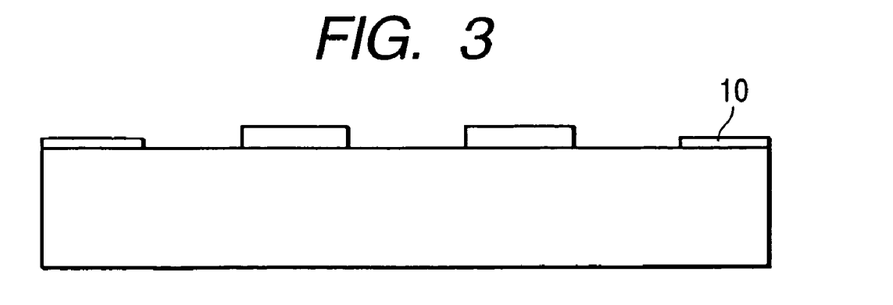
FIG. 3 is a sectional view of a silicon substrate having resin layers (adhesion layers) formed thereon of the present invention.

A resin layer (adhesion layer) 10 having a thickness of 1 to 3 μm is formed on the substrate by a coating method such as spin coating, roll coating or slit coating, as shown in FIG. 3. The resin layer 10 used in this case is used to increase adhesion between a liquid path forming member 4 and a supporting substrate described hereinafter. It is required for the resin layer to have excellent adhesion to both an inorganic insulating layer (not shown) such as an SiN layer or an SiO$_2$ layer formed on the silicon substrate 9 and an organic material of the liquid path forming member. In addition, since the resin layer is a member which may contact with the ink, it is particularly required for the resin layer to maintain excellent adhesion to those constituent members even under alkaline conditions.

Further, as shown in FIG. 3, the resin layer (adhesion layer) 10 is required to be patterned such that it is not formed on the ink ejection pressure generating element 2 and an ink supply orifice 7 described hereinafter. For this reason, a resin having photosensitivity is used for the resin layer. As a result of extensive investigations, the inventors of the present invention have found that a photosensitive resin composition including a polyetheramide resin having a repeating unit represented by the following formula (1), a compound that generates an acid by light irradiation (acid-generating agent), and a crosslinking agent for the polyetheramide resin that acts under acidic conditions is suitably used as a material satisfying those characteristics.

The polyetheramide resin, acid-generating agent and crosslinking agent are blended in a proportion of preferably 0.5 to 10 of the acid-generating agent and 1 to 40 of the crosslinking agent, more preferably 1 to 5 of the acid-generating agent and 10 to 30 of the crosslinking agent to 100 of the polyetheramide resin.

For example, a resin represented by the following formula (1) is suitably used as the polyetheramide resin used in the photosensitive resin composition of the present invention. The polyetheramide resin represented by the formula (1) can be prepared by a conventional method as described in, for example, Japanese Patent Application Laid-Open No. 63-6112.

such as hexamethylol melamine, tetramethylol melamine, hexamethoxymethyl melamine, tetramethoxymethyl melamine, hexaethoxymethyl melamine or tetraethoxymethyl melamine, and its alkyl ether compounds, and their partial condensation compounds are suitably used. Further, from the viewpoint of excellent photoreactivity and storage stability, crosslinking agents containing a monomer of hexamethoxymethyl melamine in an amount of 90% or more are particularly preferably used.

The photosensitive resin composition including those components is diluted with a solvent containing N-methyl-2-pyrrolidone to a concentration of 5 to 20 wt %, and then applied on a substrate by a coating method such as spin coating, roll coating or slit coating. Besides N-methyl-2-pyrrolidone, diethylene glycol dimethyl ether, triethylene glycol dimethyl ether and the like can be used as the solvent.

Formula (1)

wherein $R^1$ to $R^4$ each independently represent a hydrogen atom, an alkyl group having 1 to 4 carbon atoms, an alkoxyl group having 1 to 4 carbon atoms, or a halogen atom; $R^5$ and $R^6$ each independently represent a hydrogen atom, an alkyl group having 1 to 4 carbon atoms, or a halogenated alkyl group having 1 to 4 carbon atoms; $Ar_1$ represents substituted or unsubstituted phenylene, biphenylene, or naphthylene; and n is a positive integer.

The polyetheramide resin used in the present invention is obtained by, for example, polycondensing a dichloride of terephthalic acid, isophthalic acid, oxydibenzoic acid, biphenyldicarboxylic acid or naphthalenedicarboxylic acid with a diamine such as 2,2-bis{4-(4-aminophenoxy)phenyl}propane or 2,2-bis{3-methyl-4-(4-aminophenoxy)phenyl}propane. Resins obtained by adding, as another component than the above components, diamines such as 4,4'-diaminodiphenylmethane or 3,3'-diaminodiphenylsulfone for the purpose of, for example, improving heat resistance and conducting polycondensation may be used.

The polyetheramide resin has a weight average molecular weight ($\overline{Mw}$) of preferably 100,000 to 5,000, more preferably 20,000 to 50,000.

If the polyetheramide resin has a weight average molecular weight ($\overline{Mw}$) not lower than 100,000, definition lowers, and furthermore solubility to a coating solvent lowers. On the other hand, if it has a $\overline{Mw}$ not higher than 5,000, coatability and film property extremely lower.

$Ar_1$ is preferably p-phenylene or m-phenylene.

Examples of the compound generating an acid by light irradiation that can suitably be used in the present invention include onium salts such as iodonium salt or sulfonium salt, halogenated triazine compounds, disulfone compounds and sulfonic acid ester compounds.

Examples of the crosslinking agent for the polyetheramide resin to act under acidic conditions, which can suitably be used in the present invention, include melamine compounds that causes condensation reaction with an imino group in the polyetheramide resin under acidic conditions, and urea compounds. In particular, methylolated melamines Subsequently, patterning is conducted by the general photolithographic process, and if necessary, heat treatment is applied to heat-cure the composition to thereby form a resin layer (adhesion layer) 10 as shown in FIG. 3. The photosensitive resin composition may contain, other than a coating solvent, a silane-coupling agent for the purpose of improving adhesion to a base, or a sensitizer for the purpose of improving photosensitivity.

Figure 4:
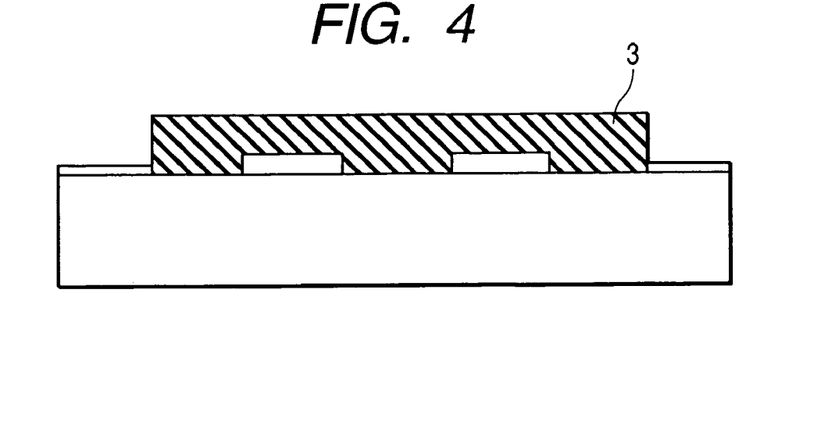
FIG. 4 is a sectional view of a silicon substrate having a liquid path pattern formed thereon of the present invention.

An ink flow path pattern 3 is formed on the silicon substrate 9 having the ink ejection pressure generating elements 2 formed thereon using a soluble resin as shown in FIG. 4. The most popular method is a formation method using a photosensitive material. The flow path pattern 3 is required to be dissolved and removed in the post-process, and for this reason, a positive type resist is preferably used. In particular, vinyl ketone type photodegradative polymer compounds such as polymethyl isopropenyl ketone or polyvinyl ketone and acrylic photodegradative polymer compounds are preferably used.

Figure 5:
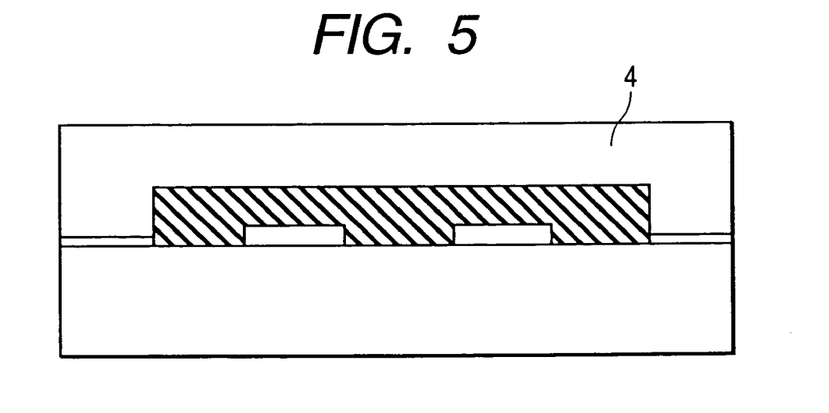
FIG. 5 is a sectional view of a silicon substrate having a resin material formed thereon constituting a liquid path forming member of the present invention.

For example, a film comprising the above-described photodegradative polymer compound and having a thickness of 10 μm is formed by a coating method such as spin coating, roll coating and slit coating. Subsequently, the desired flow path pattern 3 is formed by photolithography. A material for forming the liquid path forming member 4 having a thickness of 20 μm (planar plate) is formed on the silicon substrate 9 having the flow path pattern 3 formed thereon by a general coating method such as spin coating, roll coating, and slit coating as shown in FIG. 5. In forming the liquid path forming member 4, such properties as not to deform the flow path pattern 3 are required. Specifically, in the case where the liquid path forming member 4 is dissolved in a solvent, and the resultant solution is overcoated on the flow path pattern 3 by spin coating, roll coating or the like, it is necessary to select the solvent so as not to dissolve the soluble flow path pattern 3.

From the standpoint of forming an ink ejection orifice 6 by photolithography easily with high precision, a photosensitive member is preferably used for the liquid path forming member 4. It is required for such a photosensitive coating resin to have high mechanical strength as a structural material, and adhesion to a base, ink resistance, as well as definition for patterning a fine pattern of an ink ejection orifice. As a material satisfying those properties, a cationic polymerization-type epoxy resin composition can preferably be used.

Examples of the epoxy resin used in the present invention include a reaction product of bisphenol A and epichlorohydrin, having a molecular weight of about 900 or more, a reaction product of bromosphenol A and epichlorohydrin, a reaction product of phenol novolak or o-cresol novolak and epichlorhydrin, and polyfunctional epoxy resins having an oxycyclohexane skeleton described in Japanese Patent Application Laid-Open No. 60-161973, Japanese Patent Application Laid-Open No. 63-221121, Japanese Patent Application Laid-Open No. 64-9216 and Japanese Patent Application Laid-Open No. 2-140219. However, the usable epoxy resin is not limited to those compounds.

The usable epoxy compound has an epoxy equivalent of preferably 2,000 or lower, and more preferably 1,000 or lower. The reason for this is that if the epoxy equivalent exceeds 2,000, there is the possibility that crosslinking density lowers in curing reaction, and problems arise in adhesion and ink resistance.

The compound that generates an acid by light irradiation as described above can be used as a photocationic polymerization initiator for curing the epoxy resin. For example, commercially available products such as SP-150, SP-170 or SP-172, produced by Asahi Denka Co., can preferably be used.

The photocationic polymerization initiator can promote cationic polymerization by using a reducing agent in combination and heating (crosslinking density is improved as compared with a sole photocationic polymerization). However, in the case of using a photocationic polymerization initiator and a reducing agent in combination, it is necessary to select a reducing agent so as to be a so-called redox initiator system in which reaction does not occur at an ordinary temperature and reaction occurs at a given temperature or higher (preferably 60° C. or higher). A copper compound, in particular, copper triflate (copper (II) trifluoromethane sulfonate), considering reactivity and solubility to an epoxy resin, is most preferable as such a reducing agent. If required, additives or the like can appropriately be added to the composition. For example, a flexibility imparting agent may be added for the purpose of decreasing elastic modulus of the epoxy resin, or a silane-coupling agent may be added to obtain further adhesion to a base.

Figure 6:
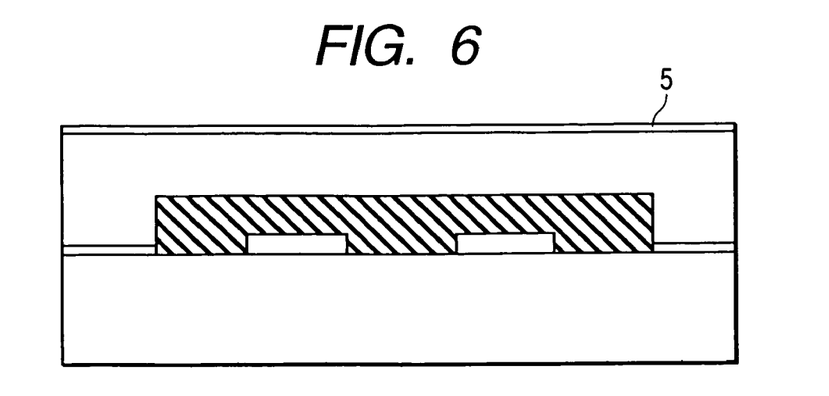
FIG. 6 is a sectional view of a silicon substrate having an ink repellent layer formed thereabove of the present invention.

An ink repellent layer 5 having photosensitivity is formed on the liquid path forming member 4 (FIG. 6). The ink repellent layer 5 can be formed by a coating method such as spin coating, roll coating or slit coating. However, since the ink repellent layer is formed on the uncured liquid path forming member 4, it is necessary that both do not exhibit compatibility with each other more than needed. As described above, where the cation-polymerizable composition is used for the liquid path forming member 4, it is preferable that a cation-polymerizable functional group is contained in the ink repellent layer 5 having photosensitivity. The liquid path forming member 4 contains a photopolymerization initiator as the essential component, but it is not always necessary to contain a photopolymerization initiator in the ink repellent layer 5. The composition may be reacted and cured by cations generated when curing a nozzle material of the liquid path forming member 4.

Figure 7:
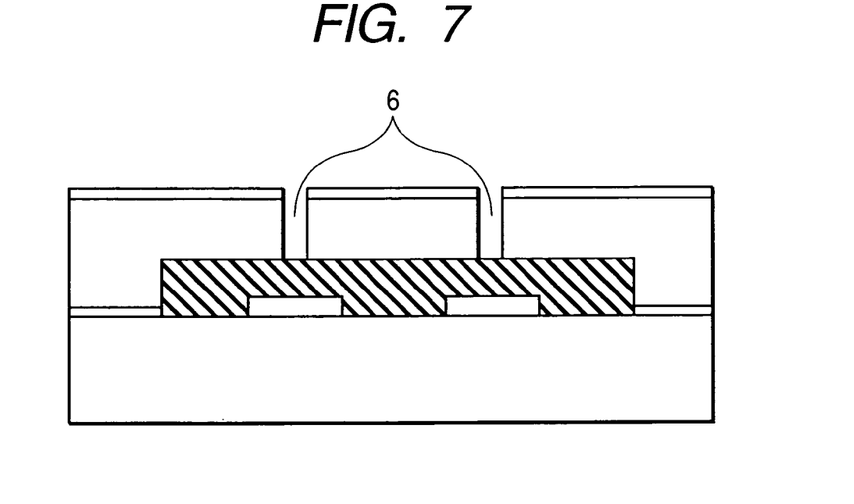
FIG. 7 is a sectional view of a silicon substrate having ink ejection orifices formed thereabove of the present invention.

Pattern exposure is conducted through a mask (not shown), followed by development to thereby form the ink ejection orifice 6 at a position facing the ink ejection pressure generating element 2 provided on the substrate (FIG. 7). The pattern-exposed liquid path forming member 4 and the ink repellent layer 5 are developed using an appropriate solvent to form the ink ejection orifice 6 as shown in FIG. 7. In this case, it is possible to dissolve and remove the flow path pattern 3 simultaneously with development. However, in general, a plurality of heads are arranged on the silicon substrate 9, and are used as ink-jet recording heads through a cutting step. Therefore, as a countermeasure against dusts in cutting, it is preferable to leave the ink flow path pattern 3 as shown in FIG. 7 (because the flow path pattern 3 remains, it is possible to prevent dusts generated in cutting from incorporating into the liquid path), and then dissolve and remove the flow path pattern 3 after a cutting step.

An ink supply orifice passing through the silicon substrate 9 is formed. As a formation method for the ink supply orifice anisotropic etching is conducted using the photosensitive resin composition according to the present invention as a mask. The silicon substrate having a <100> or <110> plane orientation as a crystal orientation can have selectivity of depth direction and width direction regarding progress direction of etching by conducting alkali-based chemical etching, thereby obtaining an anisotropy of etching. In particular, in the silicon substrate having a crystal orientation of <100>, the depth of the substrate to be etched is geometrically determined by width for which etching is conducted, so that etching depth can be controlled. For example, a hole narrowing with a gradient of 54.7° in the depth direction from an etching start face can be formed.

Figure 8:
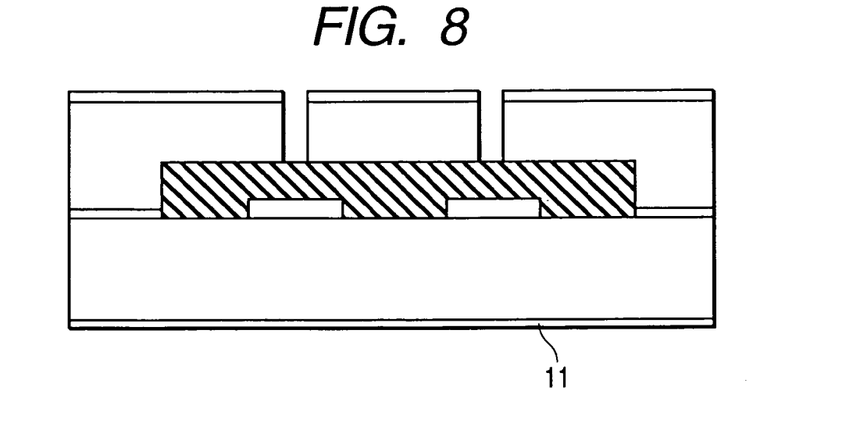
FIG. 8 is a sectional view of a silicon substrate having a photosensitive resin layer formed on the back thereof of the present invention.
Figure 9:
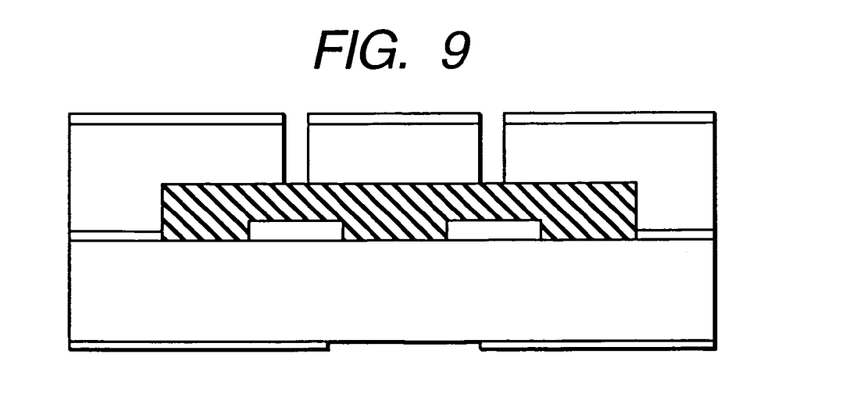
FIG. 9 is a sectional view of a silicon substrate having a thereon patterned photosensitive resin layer.
Figure 10:
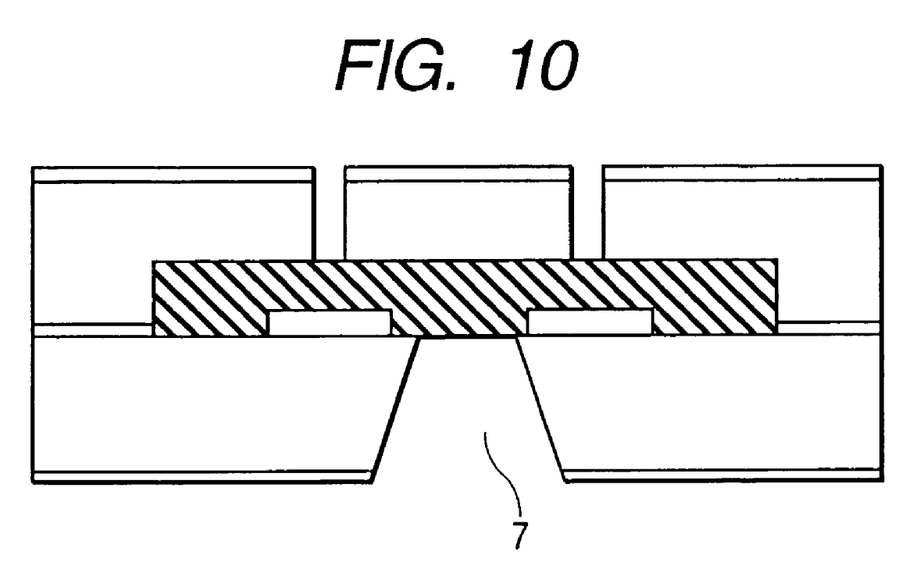
FIG. 10 is a sectional view of a silicon substrate having an ink supply orifice formed thereon of the present invention.

As shown in FIG. 8, the photosensitive resin composition layer 11 according to the present invention is first formed on the back of the silicon substrate 9, patterning is conducted using a mask (not shown) (FIG. 9) through photolithography, and the substrate is dipped in an aqueous solution of potassium hydroxide, sodium hydroxide, tetramethylammonium hydroxide or the like, which is an alkaline etchant to conduct etching, thereby forming the ink supply orifice 7 (FIG. 10). In this case, even if a two-layered structure mask having a dielectric film such as a silicon oxide film or a silicon nitride film is used for the purpose of preventing defects such as pin-holes, as described in Japanese Patent Application Laid-Open No. 2001-10070, there causes no problem. Furthermore, the etching mask may previously be formed on the back of the substrate in forming the adhesion layer.

Figure 11:
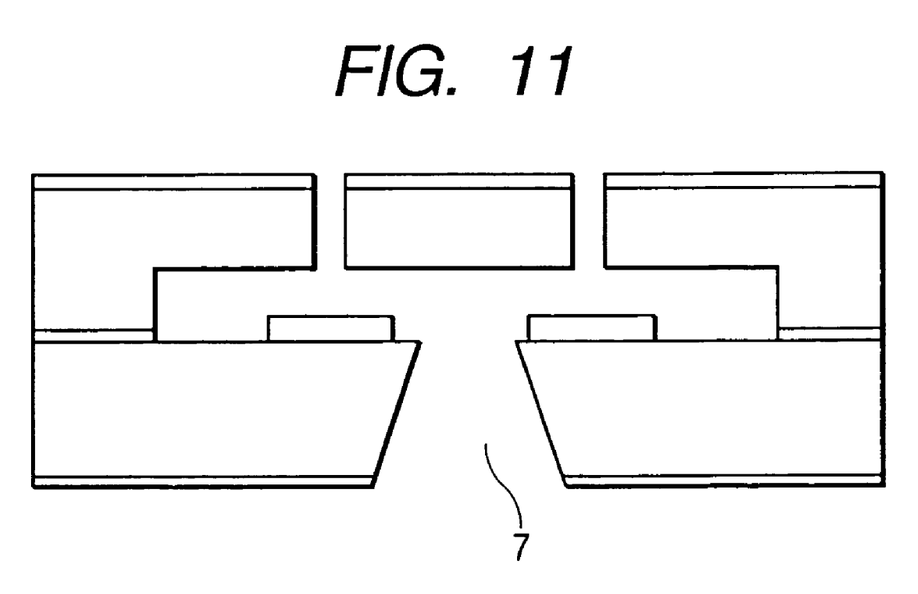
FIG. 11 is a sectional view of a completed ink-jet recording head of the present invention.

After the cutting and separating step (not shown), the flow path pattern 3 is dissolved and removed, and the photosensitive resin composition layer 10 used as an etching mask is removed if necessary. Furthermore, by applying heat treatment if necessary, the liquid path forming member 4 and the ink repellent layer 5 are completely cured. Thereafter, the substrate is bonded with a member for supplying ink (not shown), and electrical bonding (not shown) for driving the ink ejection pressure generating element is performed, thereby completing an ink-jet recording head (FIG. 11).

The present invention is described below in more detail based on examples.

EXAMPLE 1

Production of Ink-Jet Recording Head:

In this example, an ink-jet recording head was produced according to the procedures shown in FIGS. 1 to 11 as explained above, and such an ink-jet recording head was evaluated.

An electrothermal converting element (a heater made of a HfB$_2$ material) as the ink ejection pressure generating element 2 and the silicon substrate 9 having a laminate film (not shown) of SiN and Ta at ink paths and nozzle formation sites were provided (FIGS. 1 and 2). A resin layer (adhesion layer) 10 was formed using a photosensitive polyetheramide resin composition with the following composition (FIG. 3).

Polyetheramide resin having a 20 parts by weight weight average molecular weight (Mw) of 25,000 and having the following repeating unit:

Formula (3)

Crosslinking agent: 2 parts by weight
Hexamethoxymethyl melamine E-2151
(trade name: a product of Sanwa Chemical Co.)
Photopolymerization initiator: 0.5 part by weight
SP-172 (trade name: a product of Asahi Denka Co.)
N-methyl-2-pyrrolidone (NMP) 77.5 parts by weight Patterning was conducted by the following process conditions (hereinafter referred to as "patterning condition (1)"). Specifically, the above photosensitive polyetheramide resin composition was applied to a silicon substrate 9 by spin coating to form a 3.0 μm thick resin composition film. The film was pre-baked on a hot plate at 90° C. for 2 minutes. The film was exposed with a mask aligner MPA-600, manufactured by Canon Inc., at 1,000 mJ/cm$^2$, and then subjected to post exposure bake (PEB) with a hot plate at 120° C. for 2 minutes. The film was subjected to spin development in NMP (N-methyl-2-pyrrolidone) for 60 seconds and IPA (isopropyl alcohol) for 30 seconds, dried for 30 seconds, and cured in an oven at 250° C. for 30 minutes.

A flow path pattern 3 was formed on the substrate to be treated using polymethyl isopropenyl ketone (trade name: ODUR-1010, produced by Tokyo Ohka Kogyo Co.) (FIG. 4).

Patterning was conducted by the following process conditions (hereinafter referred to as "patterning condition (2)"). Specifically, a liquid path pattern film having a thickness of 10 μm was formed by spin coating, and was pre-baked with a hot plate at 120° C. for 20 minutes. The film was exposed to light having a wavelength of 254 nm at 1,500 mJ/cm$^2$ using a mask aligner PLA-620, manufactured by Canon Inc. The film was subjected to spin development in a mixed solvent of methyl isobutyl ketone/xylene=2/1 (weight ratio) for 60 seconds and a xylene solvent for 30 seconds, and dried for 30 seconds.

A photosensitive resin composition with the following composition was applied to the substrate to be treated, by spin coating (film thickness of 20 μm on a planar plate), and baked with a hot plate at 100° C. for 2 minutes to form a liquid path forming member 4 (FIG. 5).

| | |
|---|---|
| Epoxy resin (trade name: EHPE, produced by Daicel Chemical Industries) | 100 parts by weight |
| Additional resin (trade name: 1.4HFAB, produced by Central Glass Co.) | 20 parts by weight |
| Photocationic polymerization catalyst (trade name: SP-170, produced by Asahi Denka Co.) | 2 parts by weight |
| Silane-coupling agent (trade name: A-187, produced by Nippon Unicar Co.) | 5 parts by weight |
| Methyl isobutyl ketone | 100 parts by weight |
| Diethylene glycol dimethyl ether (diglyme) | 100 parts by weight |

A photosensitive resin composition having the following composition was applied to the substrate to be treated by spin coating to form a film having a thickness of 1 μm. The film was baked with a hot plate at 80° C. for 3 minutes to form an ink repellent layer 5 (FIG. 6).

| | |
|---|---|
| Epoxy resin (trade name: EHPE-3158, produced by Daicel Chemical Industries) | 35 parts by weight |
| 2,2-bis(4-glycidyloxyphenyl)-hexafluoropropane | 25 parts by weight |
| 1,4-bis(2-hydroxyhexafluoro-isopropyl)benzene | 25 parts by weight |
| 3-(2-perfluorohexyl)ethoxy-1,2-epoxypropane | 16 parts by weight |
| Silane-coupling agent (trade name: A-187, produced by Nippon Unicar Co.) | 4 parts by weight |
| Photocationic polymerization catalyst (trade name: SP-170, produced by Asahi Denka Co.) | 2 parts by weight |
| Diethyleneglycol monoethyl ether | 100 parts by weight |

Patterning of the liquid path forming member 4 and the ink repellent layer 5 was conducted under the following conditions to form an ink ejection orifice 6 (FIG. 7). Specifically, the substrate was exposed with a mask aligner MPA-600, manufactured by Canon Inc., at 200 mJ/cm$^2$, and after exposure, prebaked with a hot plate at 120° C. for 90 seconds. Spin development was performed by dipping the substrate in methyl isobutyl ketone for 60 seconds and isopropyl alcohol (IPA) for 30 seconds, followed by drying for 30 seconds and curing in an oven at 130° C. for 20 minutes. In this example, an ejection orifice pattern having an opening diameter of 15 μm was formed.

An opening shape having a width of 1 mm and a length of 10 mm was patterned on the back of the substrate to be treated using the above photosensitive polyetheramide resin composition under the same conditions as in the patterning condition (1), and heat treatment was conducted at 200° C.

for 60 minutes to form an etching mask. The substrate to be treated was dipped in 22 wt % TMAH aqueous solution maintained at 80° C. to conduct anisotropic etching of the silicon substrate 9, thereby forming an ink supply orifice 7 (FIGS. 8 to 10). In this case, for the purpose of protecting the ink repellent layer 5 from the etchant, a protective film (trade name: OBC, produced by Tokyo Ohka Kogyo Co.) was applied onto the ink repellent layer 5, and anisotropic etching was performed.

After OBC used as a protective film had been dissolved and removed using xylene, the substrate to be treated was subjected to entire exposure with PLA-620 used in the above patterning condition (2) at 3,000 mJ/cm$^2$, to solubilize the flow path pattern 3. The substrate was dipped in methyl isobutyl ketone while ultrasonic wave was applied thereto, to dissolve and remove the flow path pattern 3, thereby forming an ink-jet recording head (FIG. 11). The photosensitive polyetheramide resin composition layer used as an etching mask was removed by dry etching.

Evaluation of Adhesion:

The ink-jet recording head obtained was dipped in an alkali ink containing the following composition to conduct pressure cooker test (PCT) (121° C. saturation condition-100 hours). As a result of observation of a resin material constituting a liquid path forming member, no change was observed.

| | |
|---|---|
| Black dye | 3 parts by weight |
| Ethylene glycol | 5 parts by weight |
| Urea | 3 parts by weight |
| Isopropyl alcohol | 2 parts by weight |
| Ion-exchanged water | 87 parts by weight |

EXAMPLE 2

An ink-jet recording head was produced and subjected to PCT in the same manner as in Example 1, except for using a photosensitive polyetheramide resin composition having a sensitizer (trade name: SP-100, produced by Asahi Denka Co.) added thereto in a half amount of the photopolymerization initiator (trade name: SP-172, produced by Asahi Denka Co.) and changing the exposure amount in patterning to 500 mJ/cm$^2$. As a result, no change was observed.

EXAMPLE 3

An ink-jet recording head was produced and subjected to PCT in the same manner as in Example 1, except for using as the polyetheramide resin a resin having a weight average molecular weight ($\overline{Mw}$) of 32,000 and having the following repeating unit. As a result, no change was observed.

COMPARATIVE EXAMPLE 1

An ink-jet recording head was produced and subjected to PCT in the same manner as in Example 1, except for not forming the resin layer (adhesion layer) 10. As a result, peeling was observed between the liquid path forming member 4 and the silicon substrate 9. This is considered to have occurred because adhesion between an (SiN+Ta) layer formed on the silicon substrate 9 and the liquid path forming member 4 was not sufficient.

COMPARATIVE EXAMPLE 2

An ink-jet recording head was produced and subjected to PCT in the same manner as in Example 1, except for using a photosensitive polyimide (trade name: Photoneece UR3100, produced by Toray Industries) as the resin layer (adhesion layer) 10. Patterning of the photosensitive polyimide was conducted using the exclusive developer under the conditions specified by the manufacturer, and curing conditions were at 130° C. for 30 minutes and at 300° C. for 1 hour. As a result, the photosensitive polyimide used as the resin layer (adhesion layer) 10 completely disappeared, and peeling of the liquid path forming member 4 was observed.

COMPARATIVE EXAMPLE 3

An ink-jet recording head was produced and subjected to PCT in the same manner as in Example 1, except that dry etching was conducted by oxygen plasma using a non-photosensitive polyetheramide resin (trade name: HIMAL-1200, produced by Hitachi Chemical Co.) and further using a positive type resist (trade name: OFPR800, produced by Tokyo Ohka Kogyo Co.), and thereafter the positive type resist was dissolved and removed to form the resin layer (adhesion layer) 10. As a result, no change was observed, but process steps increased, making the process complicated.

COMPARATIVE EXAMPLE 4

An ink-jet recording head was produced in the same manner as in Example 1, except that a non-photosensitive polyetheramide resin (trade name: HIMAL-1200, produced by Hitachi Chemical Co.) was used as an etching mask for the back of the silicon substrate 9, dry etching was conducted by oxygen plasma using a positive type resist (trade name: OFPR800, produced by Tokyo Ohka Kogyo Co.), and the positive type resist was dissolved and removed to form the resin composition layer 1. As a result, the ink supply orifice 7 was formed without any problem, but process steps increased, making the process complicated.

As described above, according to the present invention, a photosensitive resin composition suitable for producing an ink-jet recording head can be provided. Further, by using the photosensitive resin composition according to the present invention, adhesion between a substrate having an ink Formula (4)

ejection pressure generating element formed thereon and a liquid path forming member is increased, and as a result, an ink-jet recording head having high reliability can be provided. Furthermore, it is possible to produce an ink-jet recording head having high reliability with a simple method.

This application claims priority from Japanese Patent Application No. 2003-170674 filed Jun. 16, 2003, which is hereby incorporated by reference herein.

What is claimed is:

1. A photosensitive resin composition, comprising:
a polyetheramide resin having a repeating unit represented by the following formula (1);
a compound that generates an acid by light irradiation; and
a crosslinking agent for the polyetheramide resin which acts under acidic conditions:

Formula (1)

wherein $R^1$ to $R^4$ each independently represent a hydrogen atom, an alkyl group having 1 to 4 carbon atoms, an alkoxyl group having 1 to 4 carbon atoms, or a halogen atom; $R^5$ and $R^6$ each independently represent a hydrogen atom, an alkyl group having 1 to 4 carbon atoms, or a halogenated alkyl group having 1 to 4 carbon atoms; $Ar_1$ represents substituted or unsubstituted phenylene, biphenylene, or naphthylene; and n is a positive integer.

2. The photosensitive resin composition according to claim 1, wherein the crosslinking agent for the polyetheramide resin comprises is a condensable melamine compound or a condensable urea compound.

3. The photosensitive resin composition according to claim 2, wherein the condensable melamine compound is a melamine compound represented by the following formula (2) and/or a condensate thereof:

wherein $R^7$ to $R^{12}$ each independently represent a hydrogen atom, a methylol group, or a methoxymethyl group.

4. The photosensitive resin composition according to claim 3, wherein the condensable melamine compound contains a monomer of hexamethoxymethyl melamine in an amount of 90% or more.

5. An ink-jet recording head, comprising:
an ejection orifice for ejecting ink;
an ink flow path in communication with the ejection orifice;
a substrate having a pressure generating element formed thereon that generates pressure for ejecting the ink from the ejection orifice; and
an ink flow path forming member that forms the ink flow path by being bound with the substrate,
wherein the ink flow path forming member is bound with the substrate through a cured product layer of the photosensitive resin composition according to claim 1.

6. The ink-jet recording head according to claim 5, wherein the ink flow path forming member is formed of a resin.

7. The ink-jet recording head according to claim 5, wherein the ink flow path forming member is formed of a cationic polymerization compound of an epoxy resin.

8. The ink-jet recording head according to claim 5, wherein the ejection orifice for ejecting the ink is provided on a side facing the pressure generating element.

9. The ink-jet recording head according to claim 5, wherein the pressure generating element comprises an electrothermal converting element.

10. A production method for an ink-jet recording head comprising an ejection orifice for ejecting ink, an ink flow path in communication with the ejection orifice, a substrate having a pressure generating element formed thereon that generates pressure for ejecting the ink from the ejection orifice, and an ink flow path forming member that forms the ink flow path by being bound with the substrate, the method comprising the steps of:
forming at least a pattern of the photosensitive resin composition according to claim 1 on the substrate having the pressure generating element formed thereon;
forming an ink path pattern with a soluble resin on the substrate having the pattern of the photosensitive resin composition formed thereon;
forming the ink path forming member on the ink path pattern;
forming the ink ejection orifice in a region of the ink path forming member which faces an arrangement position of the pressure generating element on the substrate; and
forming an ink flow path by dissolving and removing the ink flow path pattern.

11. A production method for an ink-jet recording head comprising an ejection orifice for ejecting ink, an ink flow path in communication with the ejection orifice, a substrate having a pressure generating element formed thereon that generates pressure for ejecting the ink from the ejection orifice, an ink flow path forming member that forms the ink flow path by being bound with the substrate, and an ink supply orifice in communication with the ink flow path by passing through the substrate, comprising forming the ink supply orifice passing through the substrate by etching at least using the photosensitive resin composition according to claim 1 for an etching resistant mask.

12. The production method for an ink-jet recording head according to claim 11, wherein a silicon substrate is used for the substrate, and the ink supply orifice passing through the substrate is formed by anisotropic etching.

* * * * *

UNITED STATES PATENT AND TRADEMARK OFFICE
CERTIFICATE OF CORRECTION

| | | |
|---|---|---|
| PATENT NO. | : 7,063,933 B2 | Page 1 of 1 |
| APPLICATION NO. | : 11/008221 | |
| DATED | : June 20, 2006 | |
| INVENTOR(S) | : Shoji Shiba et al. | |

It is certified that error appears in the above-identified patent and that said Letters Patent is hereby corrected as shown below:

ON THE TITLE PAGE [75]:

Inventors, "Shoji Shiba, Kanagawa (JP); Hiroe Ishikura, Kanagawa (JP)"
        should read --Shoji Shiba, Sagamihara (JP); Hiroe Ishikura, Yokohama (JP)--

COLUMN 4:

Line 43, "substrate." should read --substrate,--.

Signed and Sealed this

Ninth Day of January, 2007

JON W. DUDAS
*Director of the United States Patent and Trademark Office*